United States Patent [19]

Seidel

[11] 4,025,867
[45] May 24, 1977

[54] CAPACITANCE MAGNIFICATION CIRCUIT
[75] Inventor: Harold Seidel, Warren, N.J.
[73] Assignee: Bell Telephone Laboratories, Incorporated, Murray Hill, N.J.
[22] Filed: June 16, 1976
[21] Appl. No.: 696,641
[52] U.S. Cl. .............................. 328/127; 328/128; 328/142; 330/109; 330/110
[51] Int. Cl.² ..................... G06G 7/18; H03K 5/00; H03F 1/36
[58] Field of Search .......... 307/229, 230; 328/127, 328/128, 142; 330/107, 109, 110

[56] References Cited
UNITED STATES PATENTS

| | | | |
|---|---|---|---|
| 3,047,808 | 7/1962 | Gray | 328/127 |
| 3,094,675 | 6/1963 | Ule | 330/110 |
| 3,333,117 | 7/1967 | Carter | 307/229 |
| 3,643,173 | 2/1972 | Whitten | 330/109 |
| 3,831,117 | 8/1974 | Fletcher et al. | 307/230 |

OTHER PUBLICATIONS

"Handbook of Modern Solid State Amplifiers," by Lenk, 1974, p. 342.

Primary Examiner—Stanley D. Miller, Jr.
Attorney, Agent, or Firm—Robert O. Nimtz

[57] ABSTRACT

A capacitance magnification circuit comprising an amplifier having a positive gain G, a first capacitor having a value C1, and a second capacitor having a value C2. The first capacitor is connected between the input port of the amplifier and an input port of the circuit, the second capacitor is connected between the input and output ports of the amplifier, and the output port of the amplifier is connected to an output port of the circuit. An effective capacitance value $C1^2/\delta$ is realized when the condition $(G-1)C2-C1=\delta$ is satisfied, where $\delta$ is an arbitrarily small positive value.

8 Claims, 3 Drawing Figures

CAPACITANCE MAGNIFICATION CIRCUIT

BACKGROUND OF THE INVENTION

Magnification of a capacitance value has first been discovered as an unwanted side effect of amplification, where the plate-grid capacitance of an electron tube was effectively amplified by the gain of the tube. This phenomenon, called the Miller effect, has thereafter been employed to purposely amplify the value of a capacitance, achieving thereby a large capacitance value with a physically small capacitor. In the integrated analog circuit art, this capability has become quite important because inductors cannot be manufactured economically while small value capacitors can be easily realized. Consequently, analog integrated circuits are manufactured with solely active elements, resistors, and where necessary, small valued capacitors.

Miller effect capacitance magnification occurs when, as shown in FIG. 1, an amplifier 10 having a gain $-G$ has a capacitor 12 connected between the input 15 and output 16 ports of the amplifier. When amplifier 10 of FIG. 1 has a large input impedance, a voltage V applied to port 15 causes a current I to flow between ports 15 and 16, which current flows almost exclusively through capacitor 12 and is, therefore, proportional to the derivative of the voltage across the capacitor. Thus, since the voltage across capacitor 12 is $V-(-GV)$ or $(1+G)V$, the current flowing between ports 15 and 16 is $$I = (1+G)\dot{V}C \qquad (1)$$

where $\dot{V}$ is the derivative of $V$ and $C$ is the value of capacitor 12. From equation (1) it may be seen that a pure capacitance appears between ports 15 and 16 and that this capacitance has the value $(1+G)C$.

The prior art circuit of FIG. 1 has three drawbacks. First, for large capacitance magnification values the gain $G$ must be large, causing the effective capacitance to be highly affected by the gain of the amplifier. Second, in order to obtain a purely capacitive impedance between ports 15 and 16, the amplifier's input impedance must be sufficiently high so as not to shunt an appreciable portion of current away from capacitor 12. Third, because of the high impedance required, it is difficult to develop an amplifier with a large gain value, resulting in a limitation in the attainable capacitance magnification.

SUMMARY OF THE INVENTION

Capacitance magnification is achieved, in accordance with the principles of this invention, with a circuit comprising an amplifier having a positive gain $G$, a first capacitor having a value $C1$, and a second capacitor having a value $C2$. The first capacitor is connected between the input port of the amplifier and an input port of the circuit, the second capacitor is connected between the input and output ports of the amplifier, and the output port of the amplifier is connected to an output port of the circuit. An effective capacitance of value $C1^2/\delta$ is realized when the condition $(G-1)C2-C1=\delta$ is satisfied, where $\delta$ is an arbitrarily small positive value.

DETAILED DESCRIPTION

Figure 2:
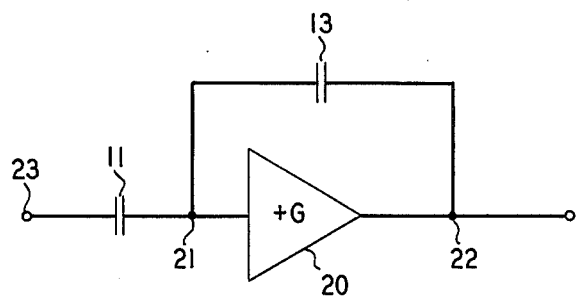
FIG. 2 illustrates a capacitance magnification circuit in accordance with the principles of this invention.

Capacitance magnification, in accordance with the principles of this invention, can be achieved with a circuit as depicted in FIG. 2.

In FIG. 2, amplifier 20 of positive gain $G$ has an input port 21 and an output port 22. A capacitor 11 having a value $C1$ is connected between input port 21 and a circuit input terminal 23. A capacitor 13 having a value $C2$ is connected between ports 21 and 22. Port 22 comprises an output terminal of the circuit.

When amplifier 20 has a high input impedance, current flowing between ports 21 and 22 flows almost exclusively through capacitor 13. Capacitor 13 is subject to the potential difference $(1-G)V$, where $V$ is the potential of port 21. Therefore, from equation (1), it may be seen that the effective capacitance between ports 21 and 22 is $(1-G)C2$ (which is negative for $G>1$). Since capacitor 11 is in series with the effective capacitance between ports 21 and 22, the net effective capacitance, $C$, between ports 23 and 22 is $$\frac{1}{C} = \frac{1}{C1} + \frac{1}{-(G-1)C2} \qquad (2)$$

or $$C = \frac{(G-1)C2\,C1}{(G-1)C2 - C1} \qquad (3)$$

A perusal of equation (3) reveals that by making the denominator of equation (3) arbitrarily small (yet positive), a magnified effective capacitance is realized. Specifically, when $(g-1)C2-C1 = \delta$ and $0<\delta<<C1$, then $$C = C1^2/\delta. \qquad (4)$$

The value of required gain, $G$, is a function of $C1$ and $C2$ as well as a function of the desired effective capacitance. For example, if $C1$ equals $C2$ and the desired effective capacitance is $1000\,C2$, then from equation (2)

$$1000\,C2 = \frac{(G-1)C2^2}{(G-2)C2} \qquad (5)$$

and $$G = 2 + \frac{1}{1000-1}. \qquad (6)$$

That is, the necessary gain $G$ must be only slightly greater than 2.

Figure 3:
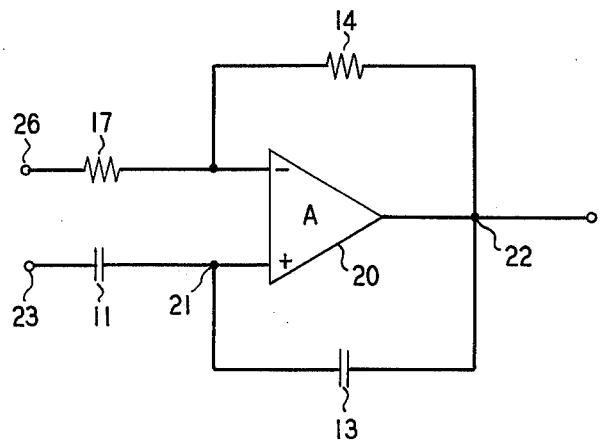
FIG. 3 depicts the FIG. 2 circuit with attendant amplifier gain determining circuitry.

To obtain a specified gain in amplifier 20, it may be convenient to employ a differential operational amplifier and to control the overall gain of the amplifier with appropriately connected feedback resistors. One such an arrangement is illustrated in FIG. 3 where amplifier 20 is a differential amplifier having a positive input, a negative input, and a large differential gain $A$. In accordance with the principles of this invention as illustrated in FIG. 2, a capacitor 13 is connected between the amplifier's output port 22 and the amplifier's positive input port 21 and a capacitor 11 is connected between the amplifier's input port 21 and a circuit input port 23. To set the gain of amplifier 20 as necessary, the circuit of FIG. 3 further comprises a resistor 14 having a value $R1$ connected between amplifier output port 22 and the amplifier's negative input port 24, and a resistor 17 having a value R2 connected between port 24 and a terminal of fixed potential 26. In accordance with standard feedback analysis techniques, it may be shown that the gain of amplifier 20 is essentially equal to 1 + R1/R2. For a desired gain of 2 + $\alpha$ where $\alpha$ is 1/1000–1, for example, R1 may be set equal to (1 + $\alpha$)R2.

Figure 1:
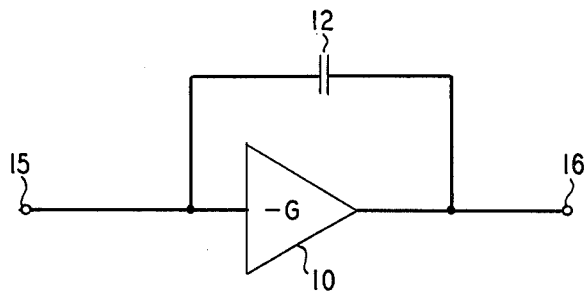
FIG. 1 shows a prior art capacitance magnification circuit.

From the above specification, it can be seen that the FIG. 2 circuit, unlike the FIG. 1 circuit, requires a very low amplifier gain G regardless of the capacitance magnification desired. It can also be seen that when a differential amplifier is used, the amplifier's differential gain A need not be very large before the effective gain G, and consequently the capacitance magnification, can be achieved with a high degree of stability independent of the exact value of A. That is, the accuracy to which a feedback amplifier may be held to a gain G is of the order of G/A. If A is very large compared to G/$\alpha$, then, for all practical purposes the amplifier gain A does not enter into the gain formulation, and the gain G is a function only of resistor accuracy. When $\alpha$ is small, say of the order of 0.001, it is not difficult to maintain an accurate 0.1% difference between two high quality resistors having the same temperature dependence. Finally, it can also be seen that, although both the FIG. 1 circuit and the FIG. 2 circuit require a high input impedance, the relatively low gain requirement for the amplifier in the FIG. 2 circuit permits an easier realization of a high input impedance.

I claim:

1. A capacitance magnification circuit comprising:
a positive gain amplifier having an input port, and an output port;
a first capacitor directly connected between said amplifier input port and said amplifier output port; and
a second capacitor connected between said amplifier input port and an input terminal of said magnification circuit.

2. The circuit of claim 1 wherein said first capacitor has a value C2, said second capacitor has a value C1 and said amplifier has a gain G such that (G–1)C2–C1=$\delta$ where $\delta$ is an arbitrarily small positive value.

3. Apparatus for developing a capacitance between a first and second terminal comprising:
an amplifier having its output port connected to said second terminal;
a first capacitor directly connected between said first terminal and a positive input port of said amplifier; and
a second capacitor connected between said output port of said amplifier and said positive input port of said amplifier.

4. The apparatus of claim 3 wherein said first capacitance has a value C1, said second capacitance has a value C2, said amplifier has a gain G, and said developed capacitance has the value $$\frac{(G-1)\,C2\,C1}{(G-1)\,C2 - C1}.$$

5. The apparatus of claim 3, further comprising:
a first resistor connected between said output port of said amplifier and a negative input port of said amplifier; and
a second resistor connected between said negative input of said amplifier and a terminal of fixed potential, said first and second resistors being selected to control the gain of said amplifier.

6. A circuit including a first capacitor of value C1 and a second capacitor of value C2 adapted to magnify the value of said first capacitor by a factor of K, characterized by:
a positive gain amplifier having an input port and an output port, with said first capacitor being connected to said input port, said second capacitor being directly connected between said input port and said output port, and said gain having the values $$\frac{K\,C1}{K\,C2 - C2} + 1.$$

7. A circuit including a first capacitor of value C1 and a second capacitor of value C2 adapted to magnify the value of said second capacitor by a factor of K, characterized by:
a positive gain amplifier having an input port and an output port, with said first capacitor being directly connected to said input port, said second capacitor being connected between said input port and said output port, and said gain having the values $$\frac{K\,C1}{K\,C2 - C1} + 1.$$

8. A capacitance magnification circuit comprising:
a positive gain amplifier having an input port and an output port;
first means, presenting a purely capacitive value across a first port, having said first port directly connected between said amplifier input port and said amplifier output port; and
second means, presenting a purely capacitive value across a second port, having said second port connected between said amplifier input port and an input terminal of said magnification circuit.

* * * * *

UNITED STATES PATENT AND TRADEMARK OFFICE
CERTIFICATE OF CORRECTION

PATENT NO. : 4,025,867
DATED : May 24, 1977
INVENTOR(S) : Harold Seidel

It is certified that error appears in the above-identified patent and that said Letters Patent are hereby corrected as shown below:

Claim 3, line 49, delete "directly"; line 52, after "capacitor" insert --directly--.

Signed and Sealed this

Fourth Day of July 1978

[SEAL]

Attest:

RUTH C. MASON
Attesting Officer

DONALD W. BANNER
Commissioner of Patents and Trademarks